(12) United States Patent
Lin et al.

(10) Patent No.: US 11,309,897 B2
(45) Date of Patent: Apr. 19, 2022

(54) LIGHTNING STRIKE COUNTER AND LIGHTNING STRIKE COUNTING METHOD

(71) Applicant: NLIGHTNING TECHNOLOGY LTD., Zhubei (TW)

(72) Inventors: Kun Tsen Lin, Zhubei (TW); Shih Peng Wu, Zhubei (TW)

(73) Assignee: NLIGHTNING TECHNOLOGY LTD., Zhubei (TW)

( * ) Notice: Subject to any disclaimer, the term of this patent is extended or adjusted under 35 U.S.C. 154(b) by 0 days.

(21) Appl. No.: 17/209,451

(22) Filed: Mar. 23, 2021

(65) Prior Publication Data

US 2022/0060190 A1 Feb. 24, 2022

(30) Foreign Application Priority Data

Aug. 21, 2020 (TW) ................................. 109128590

(51) Int. Cl.
| | |
|---|---|
| *H03K 23/00* | (2006.01) |
| *H03K 21/08* | (2006.01) |
| *H03K 23/74* | (2006.01) |
| *H03K 21/18* | (2006.01) |
| *H03K 23/78* | (2006.01) |

(52) U.S. Cl.
CPC ............ *H03K 21/08* (2013.01); *H03K 21/18* (2013.01); *H03K 23/74* (2013.01); *H03K 23/78* (2013.01)

(58) Field of Classification Search
None
See application file for complete search history.

(56) References Cited

U.S. PATENT DOCUMENTS

| | | | | |
|---|---|---|---|---|
| 3,889,185 A | * | 6/1975 | Wojtasinski | G01R 15/181 324/72 |
| 3,953,793 A | * | 4/1976 | Nilsson | G01R 19/252 324/77.11 |
| 4,156,182 A | * | 5/1979 | Brick | B64D 45/02 324/72 |
| 4,276,576 A | * | 6/1981 | Uman | H02H 3/22 340/601 |
| 6,038,118 A | * | 3/2000 | Guerra | H02H 3/22 361/111 |
| 6,452,373 B2 | * | 9/2002 | Medelius | G01R 19/0053 324/102 |
| 6,586,920 B1 | * | 7/2003 | Hirakawa | G01W 1/16 324/72 |
| 7,714,743 B1 | * | 5/2010 | Woodell | B64D 45/02 340/945 |
| 8,841,898 B2 | * | 9/2014 | Van Deventer | B64D 45/02 324/72 |
| 2011/0204631 A1 | * | 8/2011 | Minami | F03D 80/50 290/44 |

\* cited by examiner

*Primary Examiner* — Tuan T Lam
(74) *Attorney, Agent, or Firm* — Cooper Legal Group, LLC

(57) ABSTRACT

A lightning strike counter and a lightning strike counting method are disclosed. The lightning strike counter includes a lightning strike input circuit, a bipolar waveform generating circuit, and a counting circuit. The lightning strike input circuit receives a lightning strike signal from a first lightning strike input end and a second lightning strike input end. The bipolar waveform generating circuit outputs a bipolar waveform signal from a bipolar waveform output end to the counting circuit in response to the lightning strike input circuit receiving the lightning strike signal. The counting circuit outputs a counting output signal from a counting output end in response to receiving the bipolar waveform signal from a counting input end.

14 Claims, 4 Drawing Sheets

LIGHTNING STRIKE COUNTER AND LIGHTNING STRIKE COUNTING METHOD

CROSS-REFERENCES TO RELATED APPLICATIONS

This application claims priority to Taiwan Patent Application No. 109128590, filed on Aug. 21, 2020, which is hereby incorporated by reference in its entirety.

BACKGROUND OF THE INVENTION

Technical Field

The present invention relates to a counter and a counting method. Specifically, the present invention relates to a lightning strike counter and a lightning strike counting method.

Descriptions of the Related Art

For detecting and counting lightning strikes, the existing lightning strike counters generally use magnetic induction elements to detect lightning strike current flowing through wires, and then take the output current of the magnetic induction elements as the input signal of the counters. The aforesaid magnetic induction element may be an induction magnetic ring, and the corresponding operation of the magnetic ring can be: a wire pass through a magnetic ring generating an induction current when a lightning strike is detected. In order to achieve the above operation, the inner diameter of the induction magnetic ring must be larger than the outer diameter of the wire, and therefore it is difficult to reduce the volume of the induction magnetic ring. Accordingly, an urgent need exists in the art to reduce the volume of the lightning strike counter.

SUMMARY OF THE INVENTION

To solve at least the above problem, the present invention provides a lightning strike counter. The lightning strike counter comprises a lightning strike input circuit, a bipolar waveform generating circuit, and a counting circuit.

The lightning strike input circuit comprises a first lightning strike input end, a second lightning strike input end, and a protection element, wherein the first lightning strike input end and the second lightning strike input end are configured to receive a lightning strike signal, and the protection element is coupled between the first lightning strike input end and the second lightning strike input end in order to keep a voltage difference between the first lightning strike input end and the second lightning strike input end from being higher than a preset value.

The bipolar waveform generating circuit comprises a transformer, a capacitor, and a bipolar waveform output end. The transformer comprises a primary coil and a secondary coil, the primary coil and the capacitor are connected in series between the first lightning strike input end and the second lightning strike input end, a first end of the secondary coil is coupled with the bipolar waveform output end, and a second end of the secondary coil is coupled with a ground. The bipolar waveform generating circuit is configured to output a bipolar waveform signal from the bipolar waveform output end in response to the lightning strike input circuit receiving the lightning strike signal.

The counting circuit comprises a counting input end and a counting output end, wherein the counting input end is coupled with the bipolar waveform output end, and the counting circuit is configured to output a counting output signal from the counting output end in response to receiving the bipolar waveform signal from the counting input end.

To solve at least the above problem, the present invention further provides a lightning strike counting method. The lightning strike counting method is adapted for a lightning strike counter, and the lightning strike counter comprises a lightning strike input circuit, a bipolar waveform generating circuit, and a counting circuit. The lightning strike counting method comprises: receiving, by the lightning strike input circuit, a lightning strike signal; outputting, by the bipolar waveform generating circuit, a bipolar waveform signal to the counting circuit in response to the lightning strike input circuit receiving the lightning strike signal; and outputting, by the counting circuit, a counting output signal in response to receiving the bipolar waveform signal.

In the embodiments of the present invention, through the protection element, the high voltage lightning strike voltage input can be converted within a voltage range suitable for the lightning strike counter, so as to avoid the damage of the circuit of the lightning strike counter caused by the high voltage. Through the operation of the transformer and the capacitor, the bipolar waveform generating circuit can generate a bipolar waveform signal as the input signal of the counting circuit. The counting circuit then outputs a counting signal according to the input signal, so as to achieve the counting of detecting a lightning strike voltage. By adopting the aforesaid circuit of the embodiments of the present invention to count the lightning strikes, it is unnecessary to use the traditional magnetic induction element with large volume. Therefore, the present invention indeed reduces the volume of the lightning strike counter as compared to the traditional lightning strike counter.

Contents described above are not intended to limit the present invention, but only overall describes the technical problem to be solved by the present invention, the technical means that may be adopted by the present invention and the technical effect that may be achieved by the present invention to provide a basic understanding of the present invention by a person having ordinary skill in the art. According to the attached drawings and the contents described in the following embodiments, a person having ordinary skill in the art may further understand the details of various embodiments of the present invention.

BRIEF DESCRIPTION OF THE DRAWINGS

The attached drawings may assist in explaining various embodiments of the present invention, in which.

DESCRIPTION OF THE PREFERRED EMBODIMENT

Figure 1A:
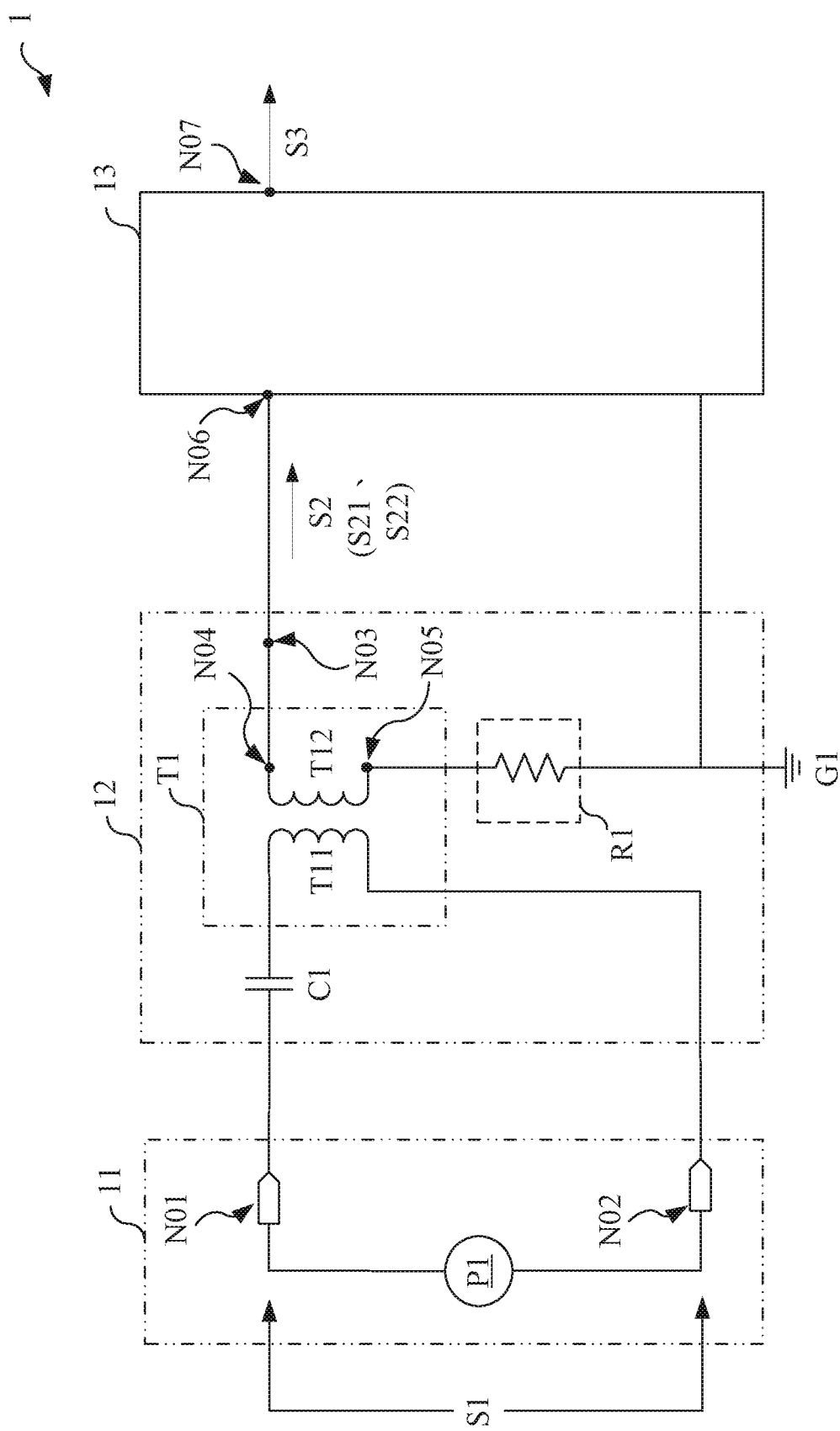
FIG. 1A illustrates a circuit diagram of a lightning strike counter according to some embodiments of the present invention.

In the following description, the present invention will be explained with reference to embodiments thereof. However, these embodiments are not intended to limit the present invention to any operations, environment, applications, structures, processes, or steps described in these embodiments. For ease of explanation, the contents that are not directly related to the embodiments of the present invention or that may be understood without special explanation will be omitted herein and in the attached drawings. Dimensions of elements and proportional relationships among individual elements in the attached drawings are only exemplary examples but not intended to limit scope claimed in the present invention. Unless stated particularly, same (or similar) reference numerals of elements may correspond to same (or similar) elements in the following description. While being implementable, the number of each element described below may be one or more, unless particularly stated.

Terms used in this disclosure are only used to describe the embodiments, and are not intended to limit the scope claimed in the present invention. Unless the context clearly indicates otherwise, singular forms "a" and "an" are intended to comprise plural forms as well. Terms such as "comprising" and "including" indicate the presence of stated features, integers, steps, operations, elements, and/or components, but do not exclude the presence of one or more other features, integers, steps, operations, elements, components, and/or combinations thereof. The term "and/or" comprises any and all combinations of one or more related listed items. In addition, unless otherwise specified, terms "connected" and "coupled" used herein may be either directly connected (i.e., connected not through other components) or indirectly connected (i.e., connected through other components).

Figure 1B:
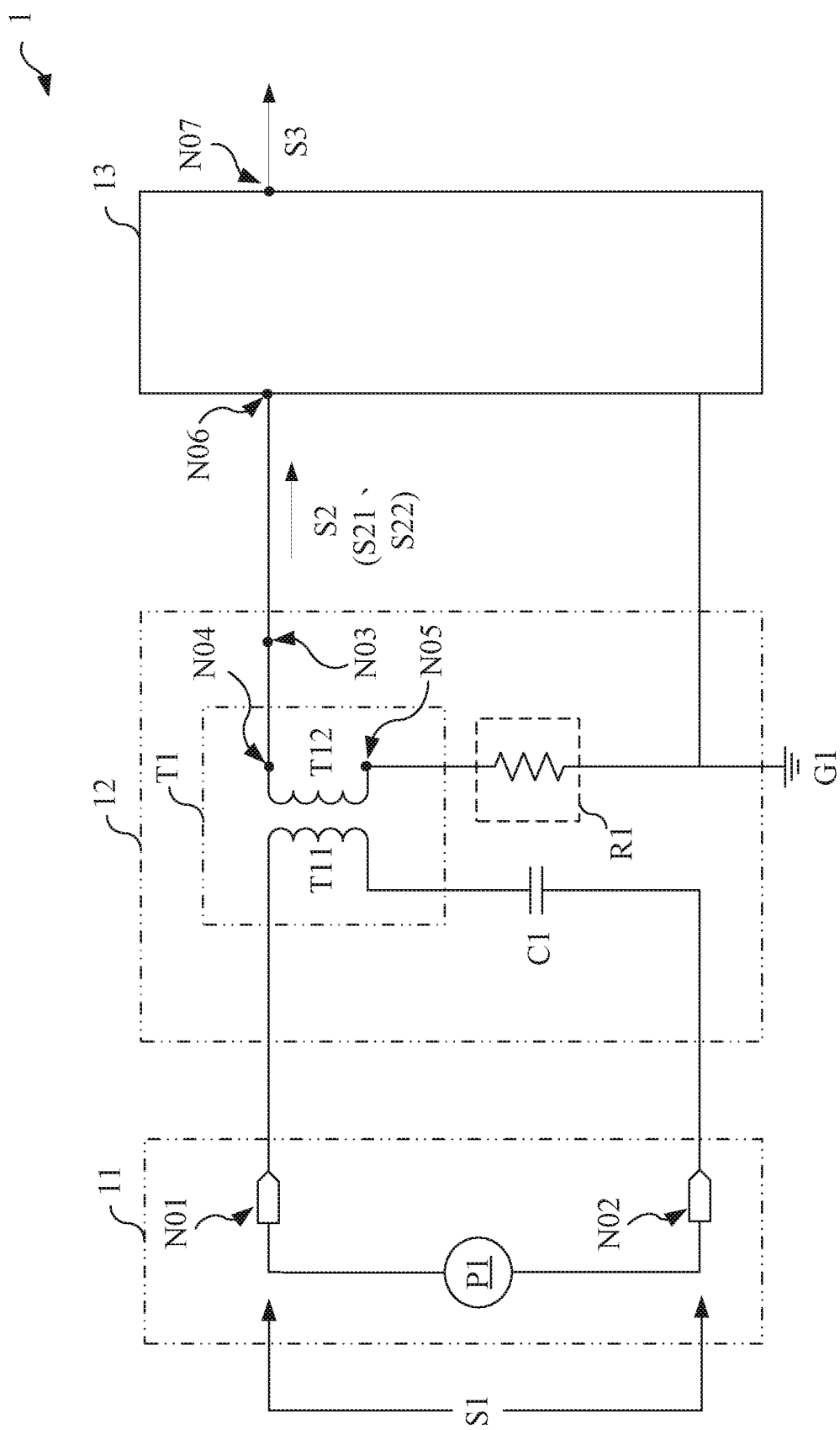
FIG. 1B illustrates a circuit diagram of another lightning strike counter according to some embodiments of the present invention.

FIG. 1A and FIG. 1B illustrate circuit diagrams of two kinds of lightning strike counters according to some embodiments of the present invention. However, the contents shown in FIG. 1A and FIG. 1B are only for illustrating the embodiments of the present invention, but not for limiting the scope claimed in the present invention.

Referring to FIG. 1A, a lightning strike counter 1 may comprise a lightning strike input circuit 11, a bipolar waveform generating circuit 12, and a counting circuit 13.

The lightning strike input circuit 11 may comprise a first lightning strike input end N01, a second lightning strike input end N02, and a protection element P1. The first lightning strike input end N01 and the second lightning strike input end N02 may be used to receive a lightning strike signal S1.

The protection element P1 is coupled between the first lightning strike input end N01 and the second lightning strike input end N02 to keep a voltage difference between the first lightning strike input end N01 and the second lightning strike input end N02 from being higher than a preset value. The protection element P1 may be one of various switch protection elements or overvoltage protection elements, which may directly or indirectly introduce current to the ground when the voltage difference between two ends thereof is higher than a preset value, thereby keeping the voltage difference between two ends thereof from being higher than the preset value, and preventing the lightning strike counter 1 from being damaged by an excessively large current. In some embodiments, the protection element P1 may be a gas discharge tube (GDT), a thyristor surge suppressor (TSS), or other switch protection elements.

The first lightning strike input end N01 and the second lightning strike input end N02 are connected to both ends of the protection element P1, so the voltage difference between two ends of the protection element P1 will be sensed. When the lightning strike signal S1 is input to both ends of the protection element P1, the protection element P1 will keep the voltage difference between both ends thereof from being higher than the preset value, and the bipolar waveform generating circuit 12 performs subsequent operations according to the voltage difference induced by the first lightning strike input end N01 and the second lightning strike input end N02.

The bipolar waveform generating circuit 12 may comprise a transformer T1, a capacitor C1, and a bipolar waveform output end N03. The transformer T1 comprises a primary coil T11 and a secondary coil T12, and the primary coil T11 and the capacitor C1 are connected in series between the first lightning strike input end N01 and the second lightning strike input end N02. In other embodiments, the relative positions of the primary coil T11 of the transformer T1 and the capacitor C1 may be interchanged. FIG. 1B illustrates an embodiment in which the positions of the primary coil T11 and the capacitor C1 are interchanged. The difference between FIG. 1B and FIG. 1A is that: in FIG. 1B, the primary coil T11 of the transformer T1 is connected to the first lightning strike input end N01, and the capacitor C1 is connected to the second lightning strike input end N02.

A first end N04 of the secondary coil T12 is coupled with the bipolar waveform output end N03, and a second end N05 of the secondary coil T12 may be coupled with a ground G1 directly (i.e., not through other elements) or indirectly (i.e., through other elements). In the embodiments illustrated in FIG. 1A and FIG. 1B, the bipolar waveform generating circuit 12 further comprises a first resistance R1, and the second end N05 of the secondary coil T12 may be connected to the ground G1 through the first resistance R1. In some other embodiments, the bipolar waveform generating circuit 12 does not comprise the first resistance R1 (i.e., the first resistance R1 in FIG. 1A is omitted), and the second end N05 of the secondary coil T12 is directly connected to the ground G1.

The bipolar waveform generating circuit 12 may be configured to output a bipolar waveform signal S2 from the bipolar waveform output end N03 in response to the lightning strike input circuit 11 receiving the lightning strike signal S1.

In detail, when the first lightning strike input end N01 and the second lightning strike input end N02 receive the lightning strike signal S1, the capacitor C1 will be charged and discharged sequentially, and generate an induced current by the primary coil T11 and the secondary coil T12 of the transformer T1 so that a bipolar waveform signal S2 will be generated at the second end N05 of the secondary coil T12 to serve as the input signal of the counting circuit 13.

The bipolar waveform signal S2 comprises a positive pulse signal S21 and a negative pulse signal S22, and there may be a time delay between the transmission of the positive pulse signal S21 and the negative pulse signal S22. The order of the transmissions of the positive pulse signal S21 and the negative pulse signal S22 is not limited. In some cases, the positive pulse signal S21 will be transmitted to the counting circuit 13 earlier than the negative pulse signal S22, and in some cases, the positive pulse signal S21 will be transmitted to the counting circuit 13 later than the negative pulse signal S22. In an embodiment where the bipolar waveform generating circuit 12 comprises the first resistance R1, the time delay may be set by adjusting the resistance value of the first resistance R1.

The withstand voltage value of the capacitor C1 must be higher than the preset protection voltage value of the protection element P1 (for example, an impulse spark over voltage of the gas discharge tube, and a switching voltage of the thyristor surge suppressor). In some embodiments, the capacitance value of the capacitor C1 may be set between 1 nF and 33 nF. The turns ratio of the primary coil T11 and the secondary coil T12 of the transformer T1 may be or may not be "1:1." According to different requirements, the voltage value of the output bipolar waveform signal S2 may be set by adjusting the aforesaid turns ratio.

The counting circuit 13 may be one of various circuits with a counting function, which may output a counting signal to an external device in response to receiving an input signal, so as to achieve the counting function. The counting circuit 13 may comprise a counting input end N06 and a counting output end N07, wherein the counting input end N06 is coupled with the bipolar waveform output end N03, and the counting circuit 13 is configured to output a counting output signal S3 from the counting output end N07 in response to receiving the bipolar waveform signal S2 from the counting input end N06.

Figure 2:
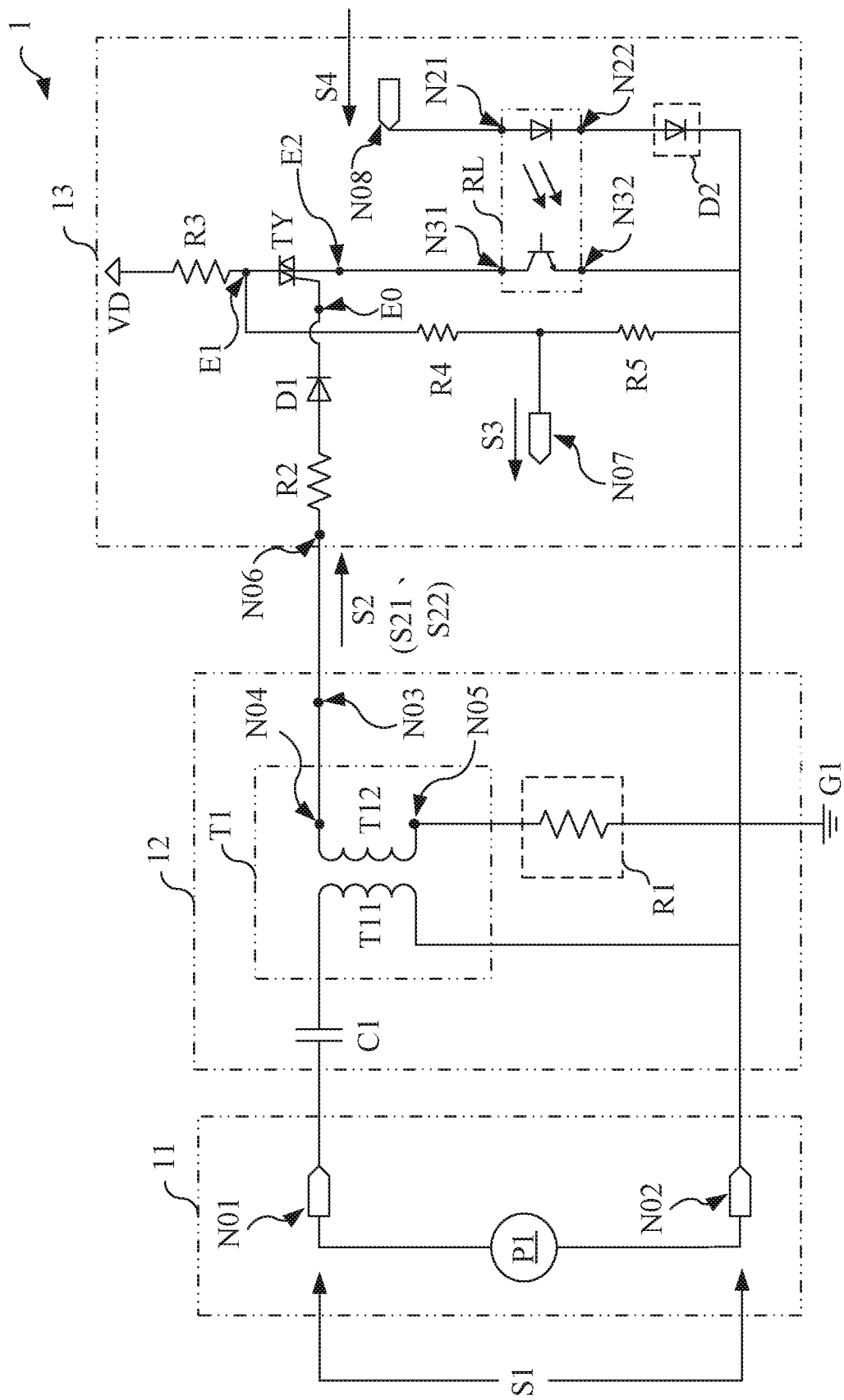
FIG. 2 illustrates a circuit diagram of a counting circuit in a lightning strike counter according to some embodiments of the present invention.

FIG. 2 further illustrates the circuit diagram of a counting circuit 13 in the lightning strike counter 1 according to some embodiments of the present invention. However, the contents shown in FIG. 2 are only for illustrating the embodiments of the present invention, but not for limiting the scope claimed in the present invention.

Referring to FIG. 2, the counting circuit 13 may further comprise a second resistance R2, a third resistance R3, a fourth resistance R4, a fifth resistance R5, a first diode D1, a thyristor TY, a relay RL, and a reset signal input end N08. The thyristor TY comprises a control terminal E0, a first electrode E1, and a second electrode E2. The relay RL comprises a first controlling end N21, a second controlling end N22, a first controlled end N31, and a second controlled end N32.

The second resistance R2 is coupled between the counting input end N06 and an anode of the first diode D1, a cathode of the first diode D1 is coupled with the control terminal E0 of the thyristor TY, the first end of the third resistance R3 is coupled with a voltage source VD, the second end of the third resistance R3 is coupled with the first electrode E1 of the thyristor TY and the first end of the fourth resistance R4, the second end of the fourth resistance R4 is coupled with the counting output end N07 and the first end of the fifth resistance R5, the second electrode E2 of the thyristor TY is coupled with the first controlled end N31 of the relay, the first controlling end N21 of the relay is coupled with the reset signal input end N08, the second end of the fifth resistance R5 and the second controlled end N32 of the relay RL are coupled with the ground G1, and the second controlling end N22 of the relay RL is directly (i.e., not through other elements) or indirectly (i.e., through other elements) coupled with the ground G1.

The first diode D1 may be one of various kinds of diodes, and is configured to prevent current from flowing backward from the ground G1 into the control terminal E0 of the thyristor TY. The second resistance R2 may be configured to adjust the magnitude of current entering into the control terminal E0 of the thyristor TY. In some embodiments, the resistance value of the second resistance R2 may be set between "0" and "1000" ohms. The third resistance R3 may be configured to control the magnitude of current flowing into the first electrode E1 of the thyristor TY and make the thyristor TY meet the conduction/non-conduction condition. The resistance value of the third resistance R3 may be adjusted according to the magnitude of voltage of the voltage source VD. According to different requirements, the fourth resistance R4 and the fifth resistance R5 may be configured to adjust the magnitude of voltage of the counting output end N07 in a voltage division manner.

In the embodiment illustrated in FIG. 2, the counting circuit 13 may further comprise a second diode D2, an anode of the second diode D2 is coupled with the second controlling end N22 of the relay RL, and a cathode of the second diode D2 is coupled with the ground G1. The second diode D2 may be one of various kinds of diodes, and may prevent the current from flowing backward from the second controlling end N22 to the first controlling end N21 of the relay RL. In some other embodiments (for example, in a case when the relay RL does not have current flowing backward from the second controlling end N22 to the first controlling end N21), the counting circuit 13 may not comprise the second diode D2 (i.e., the second diode D2 in FIG. 2 can be omitted), and the second controlling end N22 of the relay RL may be directly coupled with the ground G1.

If the voltage difference between the control terminal E0 and the second electrode E2 (in this case, the second electrode E2 is the cathode) of the thyristor TY is greater than a preset value, the first electrode E1 (in this case, the first electrode E1 is the anode) and the second electrode E2 of the thyristor TY will be electrically interconnected, and a current flowing from the first electrode E1 to the second electrode E2 will be generated. That is, when the control terminal E0 of the thyristor TY receives the positive pulse signal S21 in the bipolar waveform signal S2, the first electrode E1 and the second electrode E2 of the thyristor TY will be electrically interconnected, the current provided by the voltage source VD flows to the ground G1, the voltage of the counting output end N07 changes from a high potential (e.g., "5" volts) to a low potential (e.g., "0" volt), and the counting output end N07 will output a counting output signal S3 of a low potential, which represents that one time of lighting strike is counted by the counting circuit 13.

In some embodiments, the thyristor TY may be a unidirectional thyristor or a bidirectional thyristor, but it is not limited thereto.

In the embodiment illustrated in FIG. 2, the relay RL is an optical coupler. In this embodiment, when the voltage difference between the first controlling end N21 and the second controlling end N22 of the relay RL exceeds a preset value, the light-emitting diode between the first controlling end N21 and the second controlling end N22 will emit light, and when the photo-triode between the first controlled end N31 and the second controlled end N32 receives light, a current will be generated, and the first controlled end N31 and the second controlled end N32 will be electrically interconnected.

When the reset signal input end N08 does not receive the reset signal S4, it is set to be kept at a high potential (which makes the voltage difference between the first controlling end N21 and the second controlling end N22 exceed a preset value, for example, "5" volts), so the first controlling end N21 and the second controlling end N22 are electrically interconnected when the reset signal input end N08 does not receive the reset signal S4. In response to the reset signal input end N08 receiving a reset signal S4 with a low potential (e.g., "0" volt), the first controlled end N31 and the second controlled end N32 will be disconnected, so that the second electrode E2 of the thyristor TY and the ground G1 are also disconnected, which makes the thyristor TY unable to stay in a conducting mode and become turned off. That is, the thyristor TY of the counting circuit 13 is reset, and the counting circuit 13 may generate a new counting output signal S3 in response to receiving a new bipolar waveform signal S2.

The reset signal S4 may be received from an external controller (e.g., a microcontroller). In some embodiments, the external controller may input the reset signal S4 to the counting circuit 13 to reset the counting circuit 13 in response to receiving the counting output signal S3 output from the counting output end N07.

The relay RL illustrated in FIG. 2 above is not for limitation. In some other embodiments, the relay RL may also be one of a solid state relay, a reed relay, or an electromagnetic relay if applicable.

In addition, the counting circuit 13 shown in the FIG. 2 above is not for limitation. If applicable, other counting circuits with the same function may also be used instead of the counting circuit 13 to complete the related operation of the lightning strike counter 1. For example, the counting circuit 13 may also be a Flash Counter circuit, but it is not limited thereto.

Figure 3:
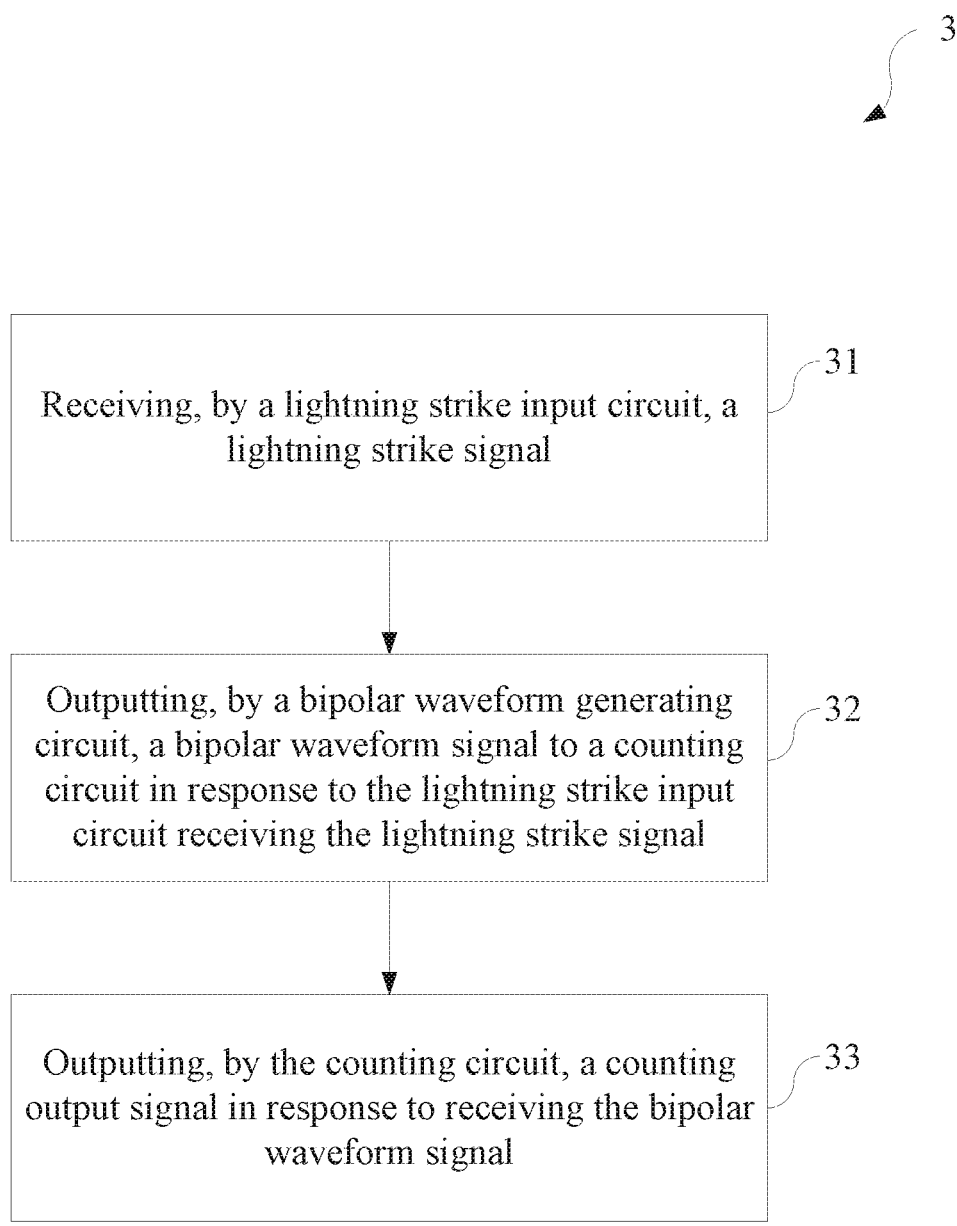
FIG. 3 illustrates a schematic diagram of a lightning strike counting method according to some embodiments of the present invention.

FIG. 3 illustrates a schematic diagram of a lightning strike counting method according to some embodiments of the present invention. However, the content shown in FIG. 3 is only for illustrating the embodiments of the present invention, but not for limiting the scope claimed in the present invention.

Referring to FIG. 3, a lightning strike counting method 3 is adapted for a lightning strike counter, and the lightning strike counter comprises a lightning strike input circuit, a bipolar waveform generating circuit, and a counting circuit. The lightning strike counting method 3 may comprise the following steps: receiving, by the lightning strike input circuit, a lightning strike signal (labeled as step 31); outputting, by the bipolar waveform generating circuit, a bipolar waveform signal to the counting circuit in response to the lightning strike input circuit receiving the lightning strike signal (labeled as step 32); and outputting, by the counting circuit, a counting output signal in response to receiving the bipolar waveform signal (labeled as step 33).

In some embodiments, the lightning strike input circuit comprises a first lightning strike input end, a second lightning strike input end, and a protection element, and the protection element is coupled between the first lightning strike input end and the second lightning strike input end in order to keep a voltage difference between the first lightning strike input end and the second lightning strike input end from being higher than a preset value. The bipolar waveform generating circuit comprises a transformer, a capacitor, and a bipolar waveform output end, wherein the transformer comprises a primary coil and a secondary coil, the primary coil and the capacitor are connected in series between the first lightning strike input end and the second lightning strike input end, a first end of the secondary coil is coupled with the bipolar waveform output end, and a second end of the secondary coil is directly or indirectly coupled with a ground. The counting circuit comprises a counting input end and a counting output end, wherein the counting input end is coupled with the bipolar waveform output end.

The lightning strike input circuit receives the lightning strike signal from the first lightning strike input end and the second lightning strike input end. The bipolar waveform generating circuit outputs the bipolar waveform signal from the bipolar waveform output end to the counting circuit in response to the lightning strike input circuit receiving the lightning strike signal. The counting circuit outputs the counting output signal from the counting output end in response to receiving the bipolar waveform signal from the counting input end.

In some embodiments, the protection element is a gas discharge tube or a thyristor surge suppressor.

In some embodiments, the bipolar waveform generating circuit further comprises a first resistance, and the first resistance is coupled between the second end of the secondary coil and the ground.

In some embodiments, the counting circuit further comprises a second resistance, a third resistance, a fourth resistance, a fifth resistance, a first diode, a thyristor, a relay, and a reset signal input end, the second resistance is coupled between the counting input end and an anode of the first diode, a cathode of the first diode is coupled with a control terminal of the thyristor, a first end of the third resistance is coupled with a voltage source, a second end of the third resistance is coupled with a first electrode of the thyristor and a first end of the fourth resistance, a second end of the fourth resistance is coupled with the counting output end and a first end of the fifth resistance, a second electrode of the thyristor is coupled with a first controlled end of the relay, a first controlling end of the relay is coupled with the reset signal input end, a second end of the fifth resistance and a second controlled end of the relay are coupled with the ground, and the second controlling end of the relay is directly or indirectly coupled with the ground. In addition to the steps 31 to 33, the lightning strike counting method 3 further comprises the following step: receiving, by the reset signal input end, a reset signal, wherein the counting circuit is reset in response to receiving the reset signal.

In some embodiments, the counting circuit further comprises a second resistance, a third resistance, a fourth resistance, a fifth resistance, a first diode, a thyristor, a relay, and a reset signal input end, the second resistance is coupled between the counting input end and an anode of the first diode, a cathode of the first diode is coupled with a control terminal of the thyristor, a first end of the third resistance is coupled with a voltage source, a second end of the third resistance is coupled with a first electrode of the thyristor and a first end of the fourth resistance, a second end of the fourth resistance is coupled with the counting output end and a first end of the fifth resistance, a second electrode of the thyristor is coupled with a first controlled end of the relay, a first controlling end of the relay is coupled with the reset signal input end, a second end of the fifth resistance and a second controlled end of the relay are coupled with the ground, and the second controlling end of the relay is directly or indirectly coupled with the ground. In addition to the steps 31 to 33, the lightning strike counting method 3 further comprises the following step: receiving, by the reset signal input end, a reset signal, wherein the counting circuit is reset in response to receiving the reset signal. The counting circuit further comprises a second diode, an anode of the second diode is coupled with the second controlling end of the relay, and a cathode of the second diode is coupled with the ground.

In some embodiments, the counting circuit further comprises a second resistance, a third resistance, a fourth resistance, a fifth resistance, a first diode, a thyristor, a relay, and a reset signal input end, the second resistance is coupled between the counting input end and an anode of the first diode, a cathode of the first diode is coupled with a control terminal of the thyristor, a first end of the third resistance is coupled with a voltage source, a second end of the third resistance is coupled with a first electrode of the thyristor and a first end of the fourth resistance, a second end of the fourth resistance is coupled with the counting output end and a first end of the fifth resistance, a second electrode of the thyristor is coupled with a first controlled end of the relay, a first controlling end of the relay is coupled with the reset signal input end, a second end of the fifth resistance and a second controlled end of the relay are coupled with the ground, and the second controlling end of the relay is directly or indirectly coupled with the ground. In addition to the steps 31 to 33, the lightning strike counting method 3 further comprises the following step: receiving, by the reset signal input end, a reset signal, wherein the counting circuit is reset in response to receiving the reset signal. The thyristor is a unidirectional thyristor or a bidirectional thyristor.

In some embodiments, the counting circuit further comprises a second resistance, a third resistance, a fourth resistance, a fifth resistance, a first diode, a thyristor, a relay, and a reset signal input end, the second resistance is coupled between the counting input end and an anode of the first diode, a cathode of the first diode is coupled with a control terminal of the thyristor, a first end of the third resistance is coupled with a voltage source, a second end of the third resistance is coupled with a first electrode of the thyristor and a first end of the fourth resistance, a second end of the fourth resistance is coupled with the counting output end and a first end of the fifth resistance, a second electrode of the thyristor is coupled with a first controlled end of the relay, a first controlling end of the relay is coupled with the reset signal input end, a second end of the fifth resistance and a second controlled end of the relay are coupled with the ground, and the second controlling end of the relay is directly or indirectly coupled with the ground. In addition to the steps 31 to 33, the lightning strike counting method 3 further comprises the following step: receiving, by the reset signal input end, a reset signal, wherein the counting circuit is reset in response to receiving the reset signal. The relay is one of a solid state relay, an optical coupler, a reed relay, or an electromagnetic relay.

Each embodiment of the lightning strike counting method 3 essentially corresponds to a certain embodiment of the lightning strike counter 1. Therefore, even though not each embodiment of the lightning strike counting method 3 is described in detail above, a person having ordinary skill in the art may directly understand the unstated embodiments of the lightning strike counting method 3 according to the above description of the lightning strike counter 1.

The above invention is related to the detailed technical contents and inventive features thereof for some embodiments of the present invention, but such invention is not to limit the present invention. A person having ordinary skill in this field may proceed with a variety of modifications and replacements based on the inventions and suggestions of the invention as described without departing from the characteristics thereof. Nevertheless, although such modifications and replacements are not fully disclosed in the above descriptions, they have substantially been covered in the following claims as appended.

What is claimed is:

1. A lightning strike counter, comprising:
a lightning strike input circuit, comprising a first lightning strike input end, a second lightning strike input end, and a protection element, wherein the first lightning strike input end and the second lightning strike input end are configured to receive a lightning strike signal, and the protection element is coupled between the first lightning strike input end and the second lightning strike input end in order to keep a voltage difference between the first lightning strike input end and the second lightning strike input end from being higher than a preset value;
a bipolar waveform generating circuit, comprising a transformer, a capacitor, and a bipolar waveform output end, wherein:
the transformer comprises a primary coil and a secondary coil, the primary coil and the capacitor are connected in series between the first lightning strike input end and the second lightning strike input end, a first end of the secondary coil is coupled with the bipolar waveform output end, and a second end of the secondary coil is coupled with a ground; and
the bipolar waveform generating circuit is configured to output a bipolar waveform signal from the bipolar waveform output end in response to the lightning strike input circuit receiving the lightning strike signal; and
a counting circuit, comprising a counting input end and a counting output end, wherein the counting input end is coupled with the bipolar waveform output end, and the counting circuit is configured to output a counting output signal from the counting output end in response to receiving the bipolar waveform signal from the counting input end.

2. The lightning strike counter of claim 1, wherein the protection element is a gas discharge tube or a thyristor surge suppressor.

3. The lightning strike counter of claim 1, wherein the bipolar waveform generating circuit further comprises a first resistance, and the first resistance is coupled between the second end of the secondary coil and the ground.

4. The lightning strike counter of claim 1, wherein the counting circuit further comprises a second resistance, a third resistance, a fourth resistance, a fifth resistance, a first diode, a thyristor, a relay, and a reset signal input end, wherein:
the second resistance is coupled between the counting input end and an anode of the first diode, a cathode of the first diode is coupled with a control terminal of the thyristor, a first end of the third resistance is coupled with a voltage source, a second end of the third resistance is coupled with a first electrode of the thyristor and a first end of the fourth resistance, a second end of the fourth resistance is coupled with the counting output end and a first end of the fifth resistance, a second electrode of the thyristor is coupled with a first controlled end of the relay, a first controlling end of the relay is coupled with the reset signal input end, a second end of the fifth resistance and a second controlled end of the relay are coupled with the ground, and a second controlling end of the relay is coupled with the ground; and
the counting circuit is reset in response to receiving a reset signal at the reset signal input end.

5. The lightning strike counter of claim 4, wherein the counting circuit further comprises a second diode, an anode of the second diode is coupled with the second controlling end of the relay, and a cathode of the second diode is coupled with the ground.

6. The lightning strike counter of claim 4, wherein the thyristor is a unidirectional thyristor or a bidirectional thyristor.

7. The lightning strike counter of claim 4, wherein the relay is one of a solid state relay, an optical coupler, a reed relay, or an electromagnetic relay.

8. A lightning strike counting method for a lightning strike counter, the lightning strike counter comprising a lightning strike input circuit, a bipolar waveform generating circuit, and a counting circuit, and the lightning strike counting method comprising:
receiving, by the lightning strike input circuit, a lightning strike signal;

outputting, by the bipolar waveform generating circuit, a bipolar waveform signal to the counting circuit in response to the lightning strike input circuit receiving the lightning strike signal; and outputting, by the counting circuit, a counting output signal in response to receiving the bipolar waveform signal;

wherein:

the lightning strike input circuit comprises a first lightning strike input end, a second lightning strike input end, and a protection element, and the protection element is coupled between the first lightning strike input end and the second lightning strike input end in order to keep a voltage difference between the first lightning strike input end and the second lightning strike input end from being higher than a preset value;

the bipolar waveform generating circuit comprises a transformer, a capacitor, and a bipolar waveform output end, wherein the transformer comprises a primary coil and a secondary coil, the primary coil and the capacitor are connected in series between the first lightning strike input end and the second lightning strike input end, a first end of the secondary coil is coupled with the bipolar waveform output end, and a second end of the secondary coil is coupled with a ground;

the counting circuit comprises a counting input end and a counting output end, wherein the counting input end is coupled with the bipolar waveform output end;

the lightning strike input circuit receives the lightning strike signal from the first lightning strike input end and the second lightning strike input end;

the bipolar waveform generating circuit outputs the bipolar waveform signal from the bipolar waveform output end to the counting circuit in response to the lightning strike input circuit receiving the lightning strike signal; and the counting circuit outputs the counting output signal from the counting output end in response to receiving the bipolar waveform signal from the counting input end.

9. The lightning strike counting method of claim 8, wherein the protection element is a gas discharge tube or a thyristor surge suppressor.

10. The lightning strike counting method of claim 8, wherein the bipolar waveform generating circuit further comprises a first resistance, and the first resistance is coupled between the second end of the secondary coil and the ground.

11. The lightning strike counting method of claim 8, wherein:

the counting circuit further comprises a second resistance, a third resistance, a fourth resistance, a fifth resistance, a first diode, a thyristor, a relay, and a reset signal input end, the second resistance is coupled between the counting input end and an anode of the first diode, a cathode of the first diode is coupled with a control terminal of the thyristor, a first end of the third resistance is coupled with a voltage source, a second end of the third resistance is coupled with a first electrode of the thyristor and a first end of the fourth resistance, a second end of the fourth resistance is coupled with the counting output end and a first end of the fifth resistance, a second electrode of the thyristor is coupled with a first controlled end of the relay, a first controlling end of the relay is coupled with the reset signal input end, a second end of the fifth resistance and a second controlled end of the relay are coupled with the ground, and a second controlling end of the relay is coupled with the ground, and the lightning strike counting method further comprises:

receiving, by the reset signal input end, a reset signal, wherein the counting circuit is reset in response to receiving the reset signal.

12. The lightning strike counting method of claim 11, wherein the counting circuit further comprises a second diode, an anode of the second diode is coupled with the second controlling end of the relay, and a cathode of the second diode is coupled with the ground.

13. The lightning strike counting method of claim 11, wherein the thyristor is a unidirectional thyristor or a bidirectional thyristor.

14. The lightning strike counting method of claim 11, wherein the relay is one of a solid state relay, an optical coupler, a reed relay, or an electromagnetic relay.

* * * * *